United States Patent
Yano et al.

(10) Patent No.: US 9,310,673 B2
(45) Date of Patent: Apr. 12, 2016

(54) PELLICLE, PRESSURE-SENSITIVE ADHESIVE FOR PELLICLE, PHOTOMASK WITH PELLICLE, AND METHOD FOR MANUFACTURING SEMICONDUCTOR DEVICE

(75) Inventors: Kohei Yano, Tokyo (JP); Daiki Yamashita, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 80 days.

(21) Appl. No.: 14/118,106

(22) PCT Filed: May 18, 2012

(86) PCT No.: PCT/JP2012/062831
§ 371 (c)(1),
(2), (4) Date: Dec. 4, 2013

(87) PCT Pub. No.: WO2012/157759
PCT Pub. Date: Nov. 22, 2012

(65) Prior Publication Data
US 2014/0170535 A1 Jun. 19, 2014

(30) Foreign Application Priority Data

May 18, 2011 (JP) .................. 2011-111832
Aug. 17, 2011 (JP) .................. 2011-178416

(51) Int. Cl.
*G03F 1/64* (2012.01)
*C09J 133/08* (2006.01)

(52) U.S. Cl.
CPC ...... *G03F 1/64* (2013.01); *C09J 133/08* (2013.01)

(58) Field of Classification Search
CPC ................ G03F 1/64; C09J 133/08
See application file for complete search history.

(56) References Cited

U.S. PATENT DOCUMENTS

| 8,685,204 B2 | 4/2014 | Nakano et al. |
| 2003/0212192 A1 | 11/2003 | Yuan et al. |
| 2006/0110664 A1 | 5/2006 | Hamada |

(Continued)

FOREIGN PATENT DOCUMENTS

| CN | 101596841 A | 11/2010 |
| JP | 5-281711 A | 10/1993 |

(Continued)

OTHER PUBLICATIONS

Machine Translation of JP-2009242786A.*

(Continued)

*Primary Examiner* — Stewart Fraser
(74) *Attorney, Agent, or Firm* — Birch, Stewart, Kolasch & Birch, LLP

(57) ABSTRACT

To provide a pellicle having a an adhesive, wherein adhesive residue is decreased at the time of peeling the pellicle from a mask after lithographic exposure and outgassing from the adhesive is suppressed The pellicle according to the present invention is a pellicle comprising a pellicle frame, a tensioned pellicle film placed on one end surface of the pellicle frame and an adhesive applied to the other end surface thereof, in which the adhesive contains a (meth)acrylic alkyl ester copolymer and a silane compound, and the (meth)acrylic alkyl ester copolymer is a copolymer of a (meth)acrylic alkyl ester having an alkyl group of 4 to 14 carbon atoms and a monomer having a functional group reactive to at least either one of an isocyanate group or an epoxy group.

18 Claims, 2 Drawing Sheets

(56) References Cited

U.S. PATENT DOCUMENTS

| | | | |
|---|---|---|---|
| 2010/0304134 A1 | | 12/2010 | Nakano et al. |
| 2012/0202144 A1* | | 8/2012 | Murakami et al. ................ 430/5 |

FOREIGN PATENT DOCUMENTS

| | | | |
|---|---|---|---|
| JP | 10-228099 A | | 8/1998 |
| JP | 2000-267261 A | | 9/2000 |
| JP | 2006-146085 A | | 6/2006 |
| JP | 2008-45059 A | | 2/2008 |
| JP | 2009242786 A | * | 10/2009 |
| JP | 2010-2895 A | | 1/2010 |
| JP | 2011-246613 A | | 12/2011 |
| TW | 200400236 A | | 1/2004 |
| TW | M292783 U | | 6/2006 |
| TW | 200938907 A | | 9/2009 |
| TW | 200951194 A1 | | 12/2009 |
| WO | WO 2011043071 A1 | * | 4/2011 |

OTHER PUBLICATIONS

Partial English translation of Taiwanese Notice of the Opinion on Examination, issued Dec. 25, 2014, for Taiwanese Application No. 101117903.

International Preliminary Report on Patentability dated Nov. 19, 2013, (Form PCT/IB/373) for International Application No. PCT/JP2012/062831.

International Search Report for International Application No. PCT/JP2012/062831 dated Jul. 17, 2012.

Notification of Transmittal of Translation of the International Preliminary Report on Patentability dated Nov. 28, 2013 (Form PCT/IB/338) for International Application No. PCT/JP2012/062831.

Written Opinion of the International Searching Authority dated Jul. 17, 2012 (Form PCT/ISA/237) for International Application No. PCT/JP2012/062831.

* cited by examiner

PELLICLE, PRESSURE-SENSITIVE ADHESIVE FOR PELLICLE, PHOTOMASK WITH PELLICLE, AND METHOD FOR MANUFACTURING SEMICONDUCTOR DEVICE

TECHNICAL FIELD

The present invention relates to e.g., a pellicle for lithography used in preventing foreign matter from adhereing to a mask (photomask) in manufacturing e.g., a semiconductor device such as LSI and VLSI or a liquid crystal display panel. In particular, the present invention relates to e.g., a pellicle for lithography in which excimer laser is used for high-resolution lithographic exposure.

BACKGROUND ART

In a photolithography step of manufacturing a semiconductor, a semiconductor manufacturing apparatus such as a stepper (reduced projection lithographic exposure apparatus) is used for forming a photoresist pattern corresponding to an integrated circuit on a wafer. A pellicle is a tensioned transparent thin film placed on one end surface of a pellicle frame and used for preventing foreign matter from directly adhereing to a mask for forming a circuit pattern. Accordingly, even if foreign matter adheres to a pellicle in a photolithography step, an image of the foreign matter is not formed on a wafer coated with a photoresist. Owing to this, e.g., short circuit and wire breakage of a semiconductor integrated circuit caused by an image of foreign matter can be prevented, with the result that yield in a photolithography step can be improved.

Usually, a pellicle is fixed on a mask with an adhesive for a pellicle and can be detached from the mask. As the adhesive, an acrylic-, rubber-, polybutene-, polyurethane- and silicone-based adhesives are known (see the following Patent Literature 1). An adhesive layer is formed on the other end surface of a pellicle frame on one end surface of which a tensioned pellicle film is provided. When a pellicle film or a mask is contaminated, the pellicle film is once peeled from the mask and dirt is removed and then the pellicle film needs to be provided again. Furthermore, in order to prevent removal of a pellicle from a mask in a lithographic exposure step, the above adhesive is required to have a sufficient adhesive strength (load bearing) for a pellicle not to peel off even if a predetermined load is applied to the pellicle.

Recently, with development of highly integrated semiconductor apparatus, exposure light having a shorter wavelength is increasingly used in a photolithography step. In other words, in drawing an integrated circuit pattern on a wafer, developing a technique for drawing a micro circuit pattern with a narrower line width is required. To deal with this, as exposure light for a photolithography stepper, for example, KrF excimer laser (wavelength 248 nm) and ArF excimer laser (wavelength 193 nm) and further F2 excimer laser (wavelength 157 nm), all having shorter wavelengths than g-line (wavelength 436 nm) and i-line (wavelength 365 nm) conventionally used, are going to be used.

With a tendency toward shorter wavelength and higher energy of exposure light, a pellicle film or a mask becomes frequently contaminated by lithographic exposure, with the result that a frequency of replacing the pellicle film or the mask increases.

CITATION LIST

Patent Literature

Patent Literature Japanese Patent Application Laid-Open No. 05-281711

Patent Literature 2: Japanese Patent Application Laid-Open No. 2006-146085

Patent Literature 3: Japanese Patent Application Laid-Open No. 2010-002895

SUMMARY OF INVENTION

Technical Problem

Under the circumstances, it has been desired to develop an adhesive for a pellicle having appropriate and stable adhesive strength and rarely leaving an adhesive as adhesive residue in replacing a pellicle. The adhesive residue refers to a phenomenon where an adhesive for a pellicle at least partly remains on a mask after peeling a pellicle from the mask. Particularly, in a photolithography step in which light having a wavelength shorter than 200 nm is used, a reaction product adheres to a mask with the passage of time of lithographic exposure, causing haze. Because of this, it is often necessary to peel a pellicle from the mask. Therefore, it is desired to develop an adhesive for a pellicle capable of rarely leaving an adhesive as a residue in peeling a pellicle from a mask. However, a silicone-based adhesive for a pellicle presently used in a photolithography step using KrF excimer laser (wavelength 248 nm) is likely to leave an adhesive as a residue.

As a method for decreasing adhesive residue, Patent Literature 2 mentioned above discloses a pellicle having an adhesive layer having a cohesive fracture strength of 20 $g/mm^2$ or more. However, there is a trade-off relationship between suppression of adhesive residue and load bearing of an adhesive. An adhesive rarely causing a residue of the adhesive has poor load bearing. A pellicle fixed with such an adhesive peels from a mask during lithographic exposure.

Patent Literature 3 mentioned above discloses an adhesive for suppressing adhesive residue. When the adhesive is used, sometimes the adhesive and a mask are glued if an adhesive of a pellicle is exposed to part of light applied to a pattern. When the pellicle is peeled from the mask after lithographic exposure, the adhesive causes cohesive fracture to leave the adhesive as a residue (see Comparative Example 1 later described).

An object of the present invention is to provide a pellicle having an adhesive, wherein the adhesive remaining on a mask after lithographic exposure is decreased and outgassing from the adhesive is suppressed, an adhesive for the pellicle, a photomask with the pellicle and a method for manufacturing a semiconductor device using the photomask.

Solution to Problem

As a result of intensive studies, the present inventors found that adhesive residue after lithographic exposure is decreased and generating of outgas including ions can be suppressed by adding a silane compound directly to an adhesive to be used in a pellicle. Based on the finding, the present invention was accomplished.

The reason why adhesive residue after peeling the pellicle is decreased by adding a silane compound to an adhesive for a pellicle has not yet been known; however, the silane compound may migrate to the interface between the adhesive and the mask, and the resultant peel force becomes appropriate. With this mechanism, adhesive residue conceivably decreases.

Furthermore, the present inventors found that adhesive residue after lithographic exposure is decreased and further generation of outgas including ions can be suppressed by adding a radical trapping agent and/or a UV absorbent directly to an adhesive for use in a pellicle, similarly to the case where a silane compound is added. Based on the finding, the present invention was accomplished. Conventionally, in view of suppressing outgassing and decreasing ions, it was important to avoid use of additives as much as possible.

An embodiment of the pellicle according to a first aspect of the present invention is directed to a pellicle having a pellicle frame, a tensioned pellicle film placed on one end surface of the pellicle frame and an adhesive applied to the other end surface thereof, in which the adhesive contains a (meth) acrylic alkyl ester copolymer and a silane compound, and the (meth)acrylic alkyl ester copolymer is a copolymer of a (meth)acrylic alkyl ester having an alkyl group of 4 to 14 carbon atoms and a monomer having a functional group reactive to at least either one of an isocyanate group or an epoxy group.

According to the embodiment of the first aspect of the present invention, the adhesive for a pellicle contains a (meth) acrylic alkyl ester copolymer and a silane compound, in which the (meth)acrylic alkyl ester copolymer is a copolymer of a (meth)acrylic alkyl ester having an alkyl group of 4 to 14 carbon atoms and a monomer having a functional group reactive to at least either one of an isocyanate group or an epoxy group.

According to the above embodiment, adhesive residue on a mask after lithographic exposure and outgas can be decreased. Since outgas can be decreased, the life of a pellicle can be extended. Furthermore, since adhesive residue is decreased, adhesive residue in a step of washing a mask after peeling a pellicle can be decreased. Note that the expression "(meth)acrylate" refers to acryl or methacryl.

It is preferable that the aforementioned silane compound have an alkylene oxide framework or an epoxy group. Furthermore, it is preferable that the content of the silane compound relative to the total of all monomers (100 parts by mass) constituting the (meth)acrylic alkyl ester copolymer be 0.001 to 7 parts by mass. The phase "the total of all monomers constituting the (meth)acrylic alkyl ester copolymer" used herein refers to the total of all (meth)acrylic alkyl esters and monomers having a functional group reactive to at least either one of an isocyanate group or an epoxy group constituting the (meth)acrylic alkyl ester copolymer. In other words, other components including a solvent and additives are excluded in calculation.

In such a pellicle, adhesive residue on a mask after lithographic exposure and outgas can be further decreased.

An embodiment of the pellicle according to a second aspect of the present invention is directed to a pellicle having a pellicle frame, a tensioned pellicle film placed on one end surface of the pellicle frame and an adhesive applied to the other end surface, in which the adhesive contains a (meth) acrylic alkyl ester copolymer, a radical trapping agent and/or a UV absorbent, and the (meth)acrylic alkyl ester copolymer is a copolymer of a (meth)acrylic alkyl ester having an alkyl group of 4 to 14 carbon atoms and a monomer having a functional group reactive to at least either one of an isocyanate group or an epoxy group.

According to the above embodiment, adhesive residue on a mask after lithographic exposure and outgas can be decreased. Since outgas can be decreased, the life of a pellicle can be extended. Furthermore, since adhesive residue is decreased, adhesive residue in a step of washing a mask after peeling a pellicle can be decreased. Note that the expression "(meth)acrylate" refers to acryl or methacryl.

It is preferable that the aforementioned radical trapping agent contain at least one of a hindered amine compound or a hindered phenol compound. Furthermore, it is preferable that the content of a radical trapping agent relative to the total of all monomers (100 parts by mass) constituting the (meth) acrylic alkyl ester copolymer be 0.001 to 5 parts by mass. The phase "the total of all monomers constituting the (meth) acrylic alkyl ester copolymer" used herein refers to the total of all (meth)acrylic alkyl esters and monomers having a functional group reactive to at least either one of an isocyanate group or an epoxy group constituting the (meth)acrylic alkyl ester copolymer. In other words, other components including a solvent and additives are excluded in calculation.

It is preferable that the aforementioned UV absorbent contain at least one of a benzophenone compound, a benzotriazole compound, a triazine compound or a benzoate compound. Furthermore, it is preferable that the content of a UV absorbent relative to the total of all monomers (100 parts by mass) constituting the (meth)acrylic alkyl ester copolymer be 0.001 to 5 parts by mass.

In the case where the aforementioned adhesive contains a radical trapping agent and a UV absorbent, it is preferable that the total content of the radical trapping agent and the UV absorbent relative to the total of all monomers (100 parts by mass) constituting the (meth)acrylic alkyl ester copolymer be 0.001 to 5 parts by mass.

In such a pellicle, adhesive residue on a mask after lithographic exposure and outgas can be further decreased.

It is preferable that the aforementioned monomer having a functional group reactive to at least either one of an isocyanate group or an epoxy group contain an acrylic acid, and that the content of the acrylic acid relative to the total of all monomers (100 parts by mass) constituting the (meth)acrylic alkyl ester copolymer be 0.1 to 5 parts by mass.

It is preferable that the aforementioned adhesive contain a reaction product between the aforementioned (meth)acrylic alkyl ester copolymer and a crosslinking agent having at least either one functional group of an isocyanate group or an epoxy group, and that the reaction product be obtained by reacting 0.05 to 3 parts by mass of the crosslinking agent with 100 parts by mass of the (meth)acrylic alkyl ester copolymer.

It is preferable that the crosslinking agent be at least either one of a polyfunctional epoxy compound or an isocyanate compound.

It is preferable that the polyfunctional epoxy compound be a nitrogen-containing epoxy compound having 2 to 4 epoxy groups.

It is preferable that the weight-average molecular weight of the (meth)acrylic alkyl ester copolymer be 500,000 to 2,500,000.

It is preferable that the thickness of the adhesive be 0.1 to 3.5 mm.

To an embodiment of the photomask with a pellicle according to the present invention, the aforementioned pellicle is provided.

An embodiment of the method for manufacturing a semiconductor device according to the present invention has a step of exposing a substrate to light with the aforementioned photomask with a pellicle.

Advantageous Effects of Invention

Owing to the present invention, it is possible to provide a pellicle having a an adhesive, wherein the adhesive remaining on a mask after lithographic exposure is decreased and outgassing from the adhesive is suppressed, an adhesive for the pellicle, a photomask provided with the pellicle, and a method for manufacturing a semiconductor device using the photomask with the pellicle.

DESCRIPTION OF EMBODIMENTS

Now, embodiments for carrying out the present invention will be more specifically described below. The following embodiments are just examples for explaining the present invention and thus the present invention is not limited to the following contents. The present invention can be appropriately modified and carried out within the scope of these.

Embodiment According to the First Aspect of the Present Invention

<Pellicle>

Figure 1:
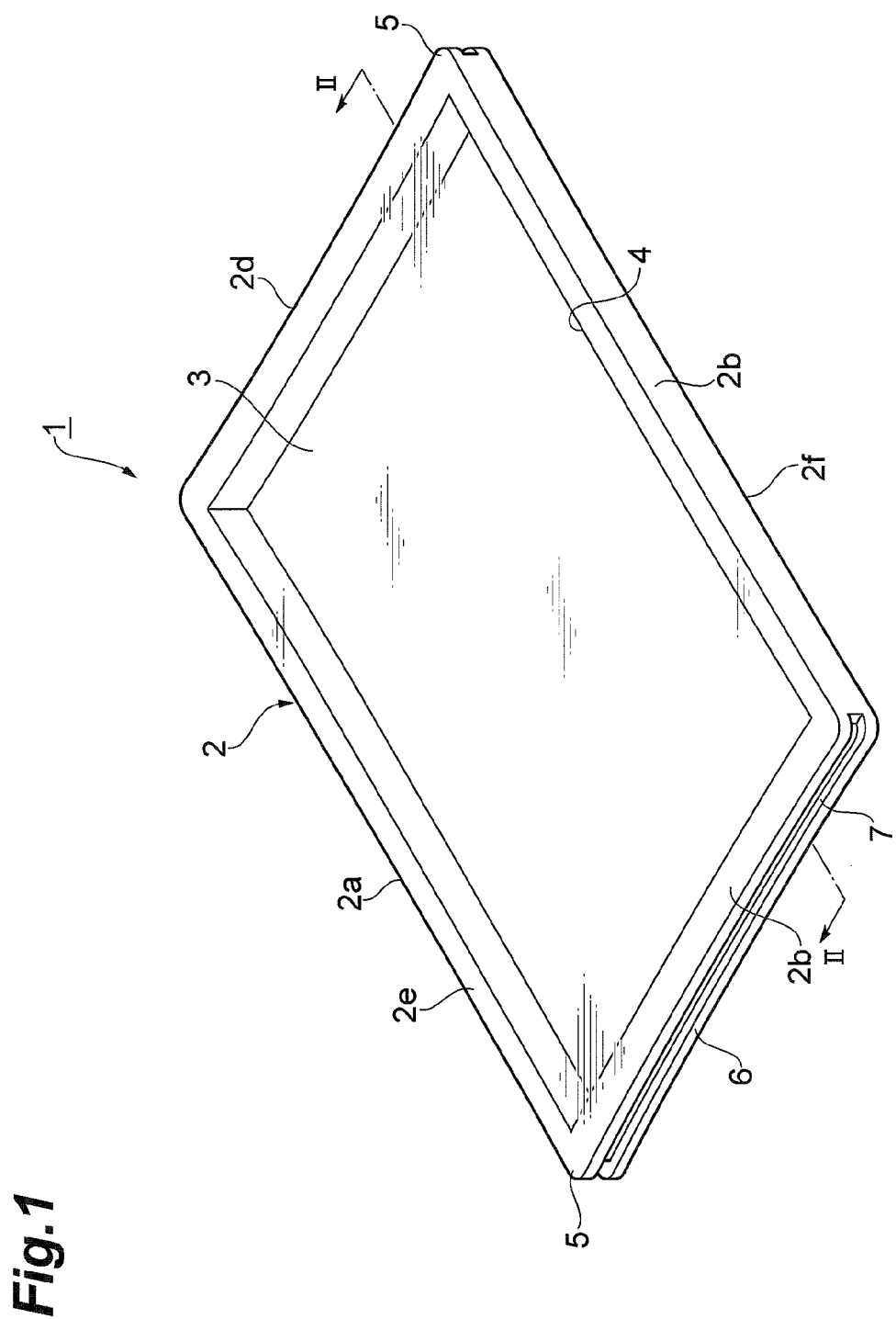
FIG. 1 shows a perspective view of a pellicle according to an embodiment of the present invention.
Figure 2:
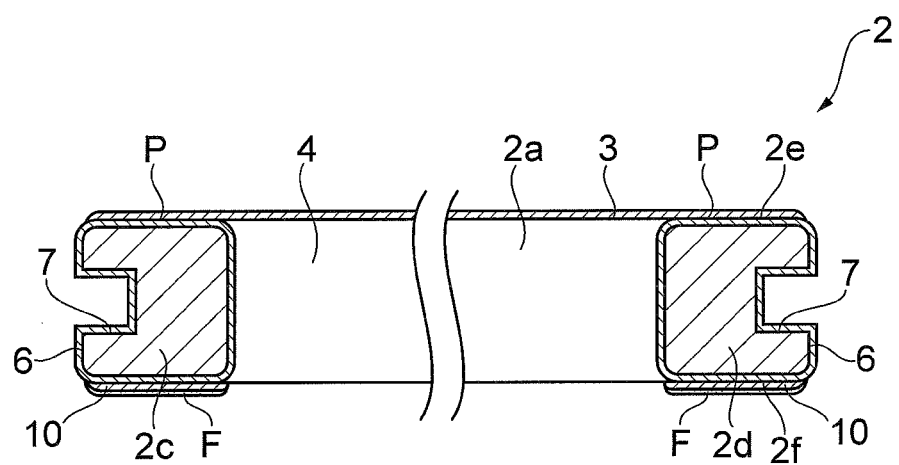
FIG. 2 shows a sectional view of the pellicle taken along the line II-II of FIG. 1.

FIG. 1 shows a perspective view of a pellicle according to an embodiment (first embodiment) of the first aspect of the present invention, and FIG. 2 shows a sectional view of the pellicle taken along the line II-II of FIG. 1. As shown in FIG. 1 and FIG. 2, pellicle 1 has a pellicle frame 2, a tensioned pellicle film 3 placed on one end surface 2e of the pellicle frame 2, an adhesive 10 (adhesive layer) applied to the other end surface 2f of the pellicle frame 2, and a protection film F covering the surface of the adhesive 10 and protecting the adhesive 10.

<Adhesive for Pellicle>

The adhesive 10 for a pellicle contains a (meth)acrylic alkyl ester copolymer and a silane compound. Note that the adhesive 10 may further contain a radical trapping agent and/or a UV absorbent, just like in the second embodiment described later. The (meth)acrylic alkyl ester copolymer is a copolymer obtained by copolymerizing a (meth)acrylic alkyl ester (hereinafter referred to as "Component A") having an alkyl group of 4 to 14 carbon atoms and a monomer (hereinafter referred to as "Component B") having a functional group reactive to at least either one of an isocyanate group or an epoxy group. Such an adhesive is preferable since it has sufficient adhesive strength with a mask and the amount of adhesive residue after peeling is low.

It is preferable that the total mass of Component A (acrylate monomer) be 99 to 80 parts by mass and the total mass of Component B be 1 to 20 parts by mass relative to the total of the monomers constituting the (meth)acrylic alkyl ester copolymer (100 parts by mass). In other words, it is preferable that the aforementioned copolymer be synthesized from a monomer mixture constituted of 99 to 80 parts by mass of Component A and 1 to 20 parts by mass of Component B. Owing to this, appropriate adhesive strength to a mask is easily provided.

(Component A)

If the monomers of Component A are classified into a group of monomers having a linear alkyl group of 4 to 14 carbon atoms (hereinafter referred to as "Component A1") and a group of monomers having a branched alkyl group of 4 to 14 carbon atoms (hereinafter referred to as "Component A2"), it is preferable that the aforementioned (meth)acrylic alkyl ester copolymer be a copolymer of a monomer mixture having Component A2 in a content of 9 to 59 parts by mass. Owing to this, the adhesive force of the adhesive is improved.

The acrylate monomer of Component A1 is a (meth)acrylic alkyl ester having an alkyl group of 4 to 14 carbon atoms. Specific examples of Component A1 include (meth)acrylic acid esters of a linear aliphatic alcohol such as butyl (meth)acrylate, hexyl (meth)acrylate, octyl (meth)acrylate, decyl (meth)acrylate, dodecyl (meth)acrylate and lauryl (meth)acrylate. These may be used alone or in combination of two types or more. Of them, Component A1 is preferably a (meth)acrylic alkyl ester having an alkyl group of 4 to 8 carbon atoms, such as butyl (meth)acrylate and octyl (meth)acrylate. Owing to this, a pellicle and a mask are attached with appropriate adhesiveness.

The acrylate monomer of Component A2 has a branched alkyl chain. Specific examples of Component A2 include isobutyl (meth)acrylate, isoamyl (meth)acrylate, 2-ethylhexyl (meth)acrylate, isooctyl (meth)acrylate and isononyl (meth)acrylate. These may be used alone or in combination of two types or more. Of them, in view of copolymerizability, isobutyl (meth)acrylate (for example, isobutyl acrylate) and 2-ethylhexyl (meth)acrylate (for example, 2-ethylhexyl acrylate) are preferable as Component A2.

(Component B)

Component B is a monomer copolymerizable with a monomer of Component A mentioned above and has a reactivity with at least either one of an isocyanate group or an epoxy group. Specific examples of Component B include carboxyl group-containing monomers such as (meth)acrylic acid, itaconic acid, maleic acid and crotonic acid; and hydroxyl group-containing monomers such as 2-hydroxyethyl(meth)acrylate, 3-hydroxypropyl (meth)acrylate, 2-hydroxypropyl (meth)acrylate and 4-hydroxybutyl (meth)acrylate. These may be used alone or in combination of two types or more. Of them, in view of e.g., copolymerizability and general versatility, a hydroxyl group-containing (meth)acrylate having a hydroxyalkyl group of 2 to 4 carbon atoms, such as 2-hydroxyethyl (meth)acrylate, 4-hydroxybutyl (meth)acrylate and a carboxyl group containing monomer such as (meth)acrylic acid are preferable as Component B. Particularly, in view of decreasing adhesive residue, (meth)acrylic acid is preferable as Component B. The content of a (meth)acrylic acid relative to the total of all monomers (100 parts by mass) constituting the (meth)acrylic alkyl ester copolymer is preferably 0.1 to 5 parts by mass, more preferably, 0.5 to 4 parts by mass, and particularly preferably 0.8 to 3 parts by mass.

((Meth)Acrylic Alkyl Ester Copolymer)

The content of the acrylate monomer of Component A1 relative to the total of all monomers (100 parts by mass) constituting the (meth)acrylic alkyl ester copolymer is 40 to 90 parts by mass and preferably 45 to 80 parts by mass. Similarly, the content of Component A2 is preferably 9 to 59 parts by mass and more preferably 15 to 50 parts by mass. Similarly, the content of Component B is preferably 1 to 20 parts by mass and more preferably 2 to 10 parts by mass. In short, it is more preferable that the (meth)acrylic alkyl ester copolymer be a copolymer of a monomer mixture in which the content of Component A1 is 40 to 90 parts by mass, the content of Component A2 is 9 to 59 parts by mass and the content of Component B is 1 to 20 parts by mass. Owing to this, adhesive residue after peeling the pellicle is easily decreased.

It is preferable that the weight-average molecular weight of a (meth)acrylic alkyl ester copolymer be 500,000 or more and 2,500,000 or less. Owing to this, the degree of cohesion and adhesive strength of an adhesive layer become appropriate.

Thus, the adhesive residue decreases, and sufficient adhesive strength and load bearing are obtained. The weight-average molecular weight is more preferably 700,000 or more and 2,300,000 or less and particularly preferably 900,000 or more and 2,000,000 or less. The weight-average molecular weight can be controlled by a method known in the art. To describe more specifically, generally, the higher the monomer concentration during polymerization reaction time, the larger the weight-average molecular weight tends to be. The smaller the amount of polymerization initiator or the lower the polymerization temperature, the larger the weight-average molecular weight tends to be. Thus, the weight-average molecular weight may be controlled by controlling the monomer concentration, amount of polymerization initiator and polymerization temperature.

A method for polymerizing a (meth)acrylate copolymer may be appropriately selected from methods known in the art such as solution polymerization, mass polymerization, emulsion polymerization, and various radical polymerizations. The (meth)acrylate copolymers obtained by these polymerization methods may be any of random copolymers, block copolymers and graft copolymers. Note that in the solution polymerization, for example, ethyl acetate or toluene may be used as a polymerization solvent.

(Polymerization Initiator)

In a specific example of solution polymerization, a polymerization reaction is performed by adding a polymerization initiator to a solution of a monomer mixture under air flow of an inactive gas such as nitrogen at 50 to 70° C. for 8 to 30 hours. The addition amount of polymerization initiator relative to the total of all monomers (100 parts by mass) constituting the (meth)acrylic alkyl ester copolymer is 0.01 to 2.0 parts by mass. The polymerization initiator to be used in a radical polymerization may be appropriately selected from those described below. A chain transfer agent, an emulsifier and others are not particularly limited, and those known in the art can be appropriately selected and put in use.

Examples of a preferable polymerization initiator include an azo compound such as 2,2'-azobisisobutyronitrile, 2,2'-azobis-2-methylbutyronitrile, 2,2'-azobis(2-methylpropionic acid)dimethyl and 4,4'-azobis-4-cyanovalerianic acid, and a peroxide compound such as benzoyl peroxide.

Examples of a method for decreasing the amount of polymerization initiator remaining on an adhesive layer include a method of decreasing the amount of polymerization initiator in polymerizing an adhesive polymer, a method of using a polymerization initiator easily decomposed with heat, and a method in which an adhesive is heated at a high temperature for a long time in a coating/drying step of the adhesive and a polymerization initiator is decomposed in a drying step.

The heat decomposition rate of a polymerization initiator is indicated by an index called a 10-hour half-life period temperature. The half-period refers to time until a half of a polymerization initiator is decomposed. The 10-hour half-life period temperature means the temperature at which a half-life period reaches 10 hours. The lower the 10-hour half-life period temperature, the easier the polymerization initiator thermally decomposes and the more rarely the polymerization initiator remains on an adhesive layer. The 10-hour half-life period temperature of a polymerization initiator is preferably 80° C. or less and more preferably 75° C. or less.

Examples of the azo-based polymerization initiator having a low 10-hour half-life period temperature include 2,2'-azobis (4-methoxy-2,4-dimethylvaleronitrile) (10-hour half-life period temperature: 30° C.), 2,2'-azobisisobutyronitrile (10-hour half-life period temperature: 60° C.), 2,2-azobis(2,4-dimethylvaleronitrile) (10-hour half-life period temperature: 51° C.), dimethyl 2,2'-azobis(2-methylpropionate) (10-hour half-life period temperature: 66° C.) and 2,2'-azobis(2-methylbutyronitrile) (10-hour half-life period temperature: 67° C.). Examples of the peroxide-based polymerization initiator having a low 10-hour half-life period temperature include dibenzoyl peroxide (10-hour half-life period temperature: 74° C.) and dilauroyl peroxide (10-hour half-life period temperature: 62° C.). Note that examples of a polymerization initiator are not limited to these.

A photoinitiator may be a possible cause for haze. As a method for reducing and controlling the amount of a photoinitiator remaining on an adhesive layer, for example, it is considered to use thermal decomposition by heating, removal of a photoinitiator by dehydration and vaporization, decomposition of a photoinitiator by irradiation of ultraviolet rays and a photoinitiator to be easily decomposed by these methods. Examples of the photoinitiator to be easily decomposed by these methods include an alkylphenone polymerization initiators and acylphosphine oxide polymerization initiators. Examples of the alkylphenone polymerization initiators include 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl]phenyl}-2-methyl-propan-1-one, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone. Examples of the acylphosphine oxide polymerization initiators include 2,4,6-trimethylbenzoyl-diphenyl-phosphine oxide and bis(2,4,6-trimethylbenzoyl)-phenylphosphine oxide.

To prevent haze, it is preferable that the total mass of a polymerization initiator remaining in an adhesive relative to the total mass of the adhesive be controlled to 8 ppm or less. Particularly, if an adhesive contains a reaction product between a (meth)acrylic alkyl ester copolymer obtained by polymerization of Component A and Component B mentioned above, and a crosslinking agent, the total mass of a polymerization initiator remaining in an adhesive relative to the total mass of the adhesive is easily controlled to 8 ppm or less.

(Crosslinking Agent)

The crosslinking agent (curing agent) to be added to an adhesive is not particularly limited as long as it has reactivity to a (meth)acrylic alkyl ester copolymer. Specific examples of the crosslinking agent include crosslinking agents usually used in adhesives, such as polyfunctional epoxy compounds, metal salts, metal alkoxides, aldehyde compounds, non-amino resin based amino compounds, urea compounds, isocyanate compounds, metal chelate compounds, melamine compounds and aziridine compounds. Of them, in view of excellent reactivity with a functional group (component) of a (meth)acrylic alkyl ester copolymer, an isocyanate compound or a polyfunctional epoxy compound is more preferable and a polyfunctional epoxy compound is suitable as a crosslinking agent.

Specific examples of the isocyanate compound include tolylene diisocyanate. Furthermore, specific examples of the polyfunctional epoxy compound include neopentylglycoldiglycidylether, polyethyleneglycoldiglycidylether, bisphenol A diglycidylether, bisphenol F diglycidylether, diglycidyl phthalate, dimer acid diglycidyl ester, triglycidylisocyanurate, diglyceroltriglycidylether, sorbitoltetraglycidylether, N,N,N',N'-tetraglycidyl m-xylenediamine, 1,3-bis(N,N-diglycidylaminomethyl)cyclohexane, N,N,N',N'-tetraglycidyldiaminodiphenylmethane.

Of them, a nitrogen-containing epoxy compound having 2 to 4 epoxy groups is preferable and a nitrogen-containing epoxy compound having 4 epoxy groups is more preferable. These epoxy compounds are excellent in reactivity. After an epoxy compound having good reactivity is mixed with a (meth)acrylic alkyl ester copolymer and applied, a crosslinking reaction is completed in a short time. More specifically, since the properties of an adhesive containing an epoxy compound having good reactivity as a crosslinking agent are stabilized in a short time, the epoxy compound is excellent in view of productivity.

The degree of swelling (by weight) can be controlled by controlling the content of a crosslinking agent. Swelling refers to a state where force of a solvent molecule (for example, toluene) entering between polymer (polymer) molecules for widening the intermolecular space is commensurate with elastic force of a mesh of crosslink. The degree of swelling is influenced by affinity between a solvent and a polymer and crosslinking degree of the polymer. Thus, the degree of swelling (by weight) can be controlled by controlling these. Generally, the higher affinity between a solvent and a polymer, the higher the degree of swelling (by weight). As rough index of affinity, an SP value (Solubility Parameter) is frequently used. Compounds having close SP values mutually have high affinity. SP values of various compounds are described in "POLYMER HANDBOOK (4th edition) WILEY-INTER SCIENCE P. 689-711". The SP value of toluene is 18.2 $(MPa^{1/2})$ and the SP value of ethyl acetate is 18.6 $(MPa^{1/2})$. These are almost the same values. Therefore, the closer the SP value of a monomer component constituting a polymer to the SP value of toluene or ethyl acetate, the higher the degree of swelling (by weight). For example, the SP value of butyl acrylate, which is a monomer component of an acrylic adhesive, is 18.0 $(MPa^{1/2})$. The SP value of isobutyl acrylate is 17.4 $(MPa^{1/2})$. The SP value of butadiene, which is a monomer component of a rubber-based adhesive is 14.5 $(MPa^{1/2})$. The SP value of isobutylene is 15.0 $(MPa^{1/2})$. The SP value of ethylene is 15.76 $(MPa^{1/2})$. The SP value of butylene is 13.7 $(MPa^{1/2})$. The SP value of dimethyl siloxane, which is a monomer component of a silicone adhesive, is 10.0 to 12.1 $(MPa^{1/2})$. Therefore, in view of high affinity between a polymer and a solvent, an acrylic adhesive is preferable.

The degree of swelling (by weight) varies also depending upon the crosslinking degree of a polymer. If the crosslinking degree is extremely low, a solvent molecule is not taken in a crosslink network of a polymer, with the result that the degree of swelling (by weight) is low. In contrast, if the crosslinking degree is extremely high, a solvent molecule cannot get in the crosslink network of a polymer, with the result that the degree of swelling (by weight) is low. Therefore, the degree of swelling (by weight) can be controlled by appropriately controlling the crosslinking degree of a polymer.

It is preferable that the content of a crosslinking agent in an adhesive for a pellicle relative to a (meth)acrylic alkyl ester copolymer (100 parts by mass) as mentioned above be 0.05 to 3 parts by mass. Owing to this, the degree of swelling (by weight) by toluene or ethyl acetate increases 5 times or more, with the result that an adhesive suitable for a pellicle can be obtained. Particularly, it is preferable that the content of a crosslinking agent be 0.05 parts by mass to 0.20 parts by mass. Owing to this, the degree of swelling (by weight) by toluene or ethyl acetate further increases and haze is suppressed, with the result that an adhesive for a pellicle rarely leaving the adhesive as a residue is obtained. In addition, an adhesive having an appropriate crosslink density and rarely and particularly affecting flatness of a photomask (deformation of a photomask can be particularly suppressed) can be obtained. If the content of a crosslinking agent is 0.20 parts by mass or less, since the crosslink density will not be excessively large, stress applied to a photomask is absorbed by an adhesive. With this mechanism, an effect of the adhesive on the flatness of a photomask is conceivably reduced. In contrast, if the content of a crosslinking agent is 0.05 parts by mass or more, since the crosslink density is not excessively low, handling ability is maintained in a manufacturing step. With this mechanism, it is considered that an adhesive is rarely left as a residue when a pellicle is peeled form a photomask.

In the case where an adhesive contains a reaction product between a (meth)acrylic alkyl ester copolymer as mentioned above and a polyfunctional epoxy compound, the degree of swelling (by weight) can be controlled at most to be about 15 times by appropriately controlling the crosslinking degree of a polymer. Particularly, it is preferable that the degree of swelling (by weight) by toluene be about 8 to 14 times. Owing to this, an organic gas such as toluene and ethyl acetate adsorbed tends to be stored in an adhesive and the amount of outgas decreases. This is considered that the mesh size of a crosslink network of a polymer becomes appropriate to catch toluene and ethyl acetate.

A (meth)acrylic alkyl ester copolymer solution and a polyfunctional epoxy compound solution are weighed, and mixed and stirred so as to obtain a homogeneous state. After the solvent is removed from the mixture by heating and drying, it is preferable that the mixture be heated. Owing to this, the reaction between a (meth)acrylic alkyl ester copolymer and a polyfunctional epoxy compound swiftly proceeds.

(Silane Compound)

An adhesive for a pellicle contains a silane compound. It is preferable that the silane compound have a unit of —(Si—O)— in a main framework. Furthermore, in view of easily decreasing adhesive residue, it is more preferable the silane compound have a polyalkylene oxide framework or an epoxy group. In view of easily improving load bearing, it is particularly preferable that the silane compound have a polyalkylene oxide framework and an epoxy group. In particular, it is most preferable that the silane compound have a polyalkylene oxide framework and an epoxy group in its side chain (not main chain terminal).

Examples of the silane compound having a unit of —(Si—O)— in the main framework include KF-96 (product name, manufactured by Shin-Etsu Chemical Co., Ltd.), KF-50 (product name, manufactured by Shin-Etsu Chemical Co., Ltd.), KF-99 (product name, manufactured by Shin-Etsu Chemical Co., Ltd.), KF-1001 (product name, manufactured by Shin-Etsu Chemical Co., Ltd.), KF-865 (product name, manufactured by Shin-Etsu Chemical Co., Ltd.), X-22-162c (product name, manufactured by Shin-Etsu Chemical Co., Ltd.), X-22-173DX (product name, manufactured by Shin-Etsu Chemical Co., Ltd.), SF8416 (product name, manufactured by Dow Toray Co., Ltd.), X-22-4272 (product name, manufactured by Shin-Etsu Chemical Co., Ltd.), SF8427 (product name, manufactured by Dow Toray Co., Ltd.), KF-6017 (product name, manufactured by Shin-Etsu Chemical Co., Ltd.), SH8400 (product name, manufactured by Dow Toray Co., Ltd.), SF8421 (product name, manufactured by Dow Toray Co., Ltd.), X-22-4741 (product name, manufactured by Shin-Etsu Chemical Co., Ltd.), KF-1002 (product name, manufactured by Shin-Etsu Chemical Co., Ltd.), X-22-3939A (product name, manufactured by Shin-Etsu Chemical Co., Ltd.) and X-22-3701E (product name, manufactured by Shin-Etsu Chemical Co., Ltd.).

Examples of the silane compound having a polyalkylene oxide framework include X-22-4272 (product name, manufactured by Shin-Etsu Chemical Co., Ltd.), SF8427 (product name, manufactured by Dow Toray Co., Ltd.), KF6017 (product name, manufactured by Shin-Etsu Chemical Co., Ltd.), SH8400 (product name, manufactured by Dow Toray Co., Ltd.), SF8421 (product name, manufactured by Dow Toray Co., Ltd.), X-22-4741 (product name, manufactured by Shin-Etsu Chemical Co., Ltd.) and KF-1002 (product name, manufactured by Shin-Etsu Chemical Co., Ltd.).

Examples of the silane compound having a polyalkylene oxide framework and an epoxy group include SF8421 (product name, manufactured by Dow Toray Co., Ltd.), X-22-4741 (product name, manufactured by Shin-Etsu Chemical Co., Ltd.) and KF-1002 (product name, manufactured by Shin-Etsu Chemical Co., Ltd.).

Examples of the polyalkylene oxide include polyethylene oxide, polypropylene oxide, polytetramethylene oxide, polypentamethylene oxide, polyhexamethylene oxide and polyheptamethylene oxide. Of these alkylene oxides, those having a structural unit of ethylene oxide, and propylene oxide are preferable since they have high hydrophilicity and cause phase separation with an acrylic adhesive and migrate into the interface between the adhesive and the mask.

The epoxy group reacts with a reactive functional group in an acrylic polymer such as a carboxyl group and chemically binds to an acrylic polymer. This is preferable in view of suppressing outgassing.

The content of a silane compound in an adhesive for a pellicle relative to the total of all monomers (100 parts by mass) constituting the (meth)acrylic alkyl ester copolymer is preferably 0.001 to 7 parts by mass, more preferably 0.001 to 5 parts by mass, particularly preferably 0.005 to 3 parts by mass and most preferably 0.01 to 1 part by mass. If the content of a silane compound is larger than 0.001 part by mass, an effect of decreasing adhesive residue is more significant. If the content of a silane compound is smaller than 7 parts by mass, a pellicle has sufficient load bearing and peeling from a mask due to bleeding of an adhesive rarely occurs, air path (void) and foaming can be suppressed.

Examples of the silane compound having a polyalkylene oxide framework and an epoxy group in its side chain (not main chain terminal) include compounds represented by the following formulas (1) and (2). Furthermore, a cyclic compound having a structural repeat unit represented by the following formula (3) is a specific example of the compound having a unit of —(Si—O)— in a main framework.

[Chemical Formula 1]

(1)

$$CH_3-\underset{\underset{CH_3}{|}}{\overset{\overset{CH_3}{|}}{Si}}-O-\left[\underset{\underset{CH_3}{|}}{\overset{\overset{CH_3}{|}}{Si}}-O\right]_x-\left[\underset{\underset{R^1}{|}}{\overset{\overset{CH_3}{|}}{Si}}-O\right]_y-\left[\underset{\underset{POA}{|}}{\overset{\overset{CH_3}{|}}{Si}}-O\right]_z-\underset{\underset{CH_3}{|}}{\overset{\overset{CH_3}{|}}{Si}}-CH_3$$

$$R^1 = O-CH_2CH\overset{O}{\underset{}{\diagdown}}CH_2$$

In the formula (1), $R^1$ represents an alkylene group, "POA" represents a polyoxyalkylene group, X, Y, and Z each represent an integer of 1 to 100. Examples of the alkylene group include a lower alkylene group having 1 to 6 carbon atoms. Examples of the polyoxyalkylene group include groups derived from lower alkylene oxide polymers such as polyoxyethylene, polyoxypropylene and polyoxy(ethylene/propylene) formed of a copolymer of ethylene oxide and propylene oxide. Specific examples of a silane compound represented by the formula (1) include MAC-2101 (product name) manufactured by Nippon Unicar Co., Ltd. and SF-8421 (product name) manufactured by Dow Corning Toray Silicone Co., Ltd.

[Chemical Formula 2]

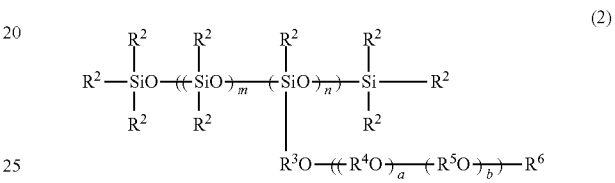

(2)

In the formula (2), $R^2$ represents a methyl group, $R^3$ to $R^5$ each represent an alkylene group, $R^6$ represents a hydrogen atom or a monovalent organic group, m represents an integer of 0 to 100, n represents an integer of 1 to 100 and a and b each independently represent an integer of 0 to 100. Reference symbols a and b do not simultaneously represent 0.

Examples of the polyoxyalkylene group include groups derived from polyoxyethylene, polyoxypropylene, polyoxybutylene and block copolymers of these.

Examples of the dimethyl silicon compound having a polyoxyalkylene group mentioned above include "KF-351A", "KF-352A", "KF-353", "KF-354L", "KF-355A", "KF-615A", "KF-945", "KF-640", "KF-641", "KF-642", "KF-643", "KF-6020", "X-22-6191", "X-22-4515", "KF-6011", "KF-6012", "KF-6013", "KF-6015", "KF-6016", "KF-6017", "X-22-4741", "KF-1002", "X-22-4952", "X-22-4272", "X-22-6266", "KF-6004", "KP-301", "KP-323", "KP-354", "KP-355", "KP-341", "KP-118", "F-501", "X-22-6191", "X-22-3506", "X-22-3004", "KF-6005", "KP-101", "KF-889", "KF-6003", "X-22-4515", "F-3031", "X-24-1430", "X-22-4991", "KP-208", "KF-6003" [Product names, which are manufactured by Shin-Etsu Chemical Co., Ltd.], "L-720", "L-7604", "Y-7006", "BY-16-201", "FZ-77", "FZ-2101", "FZ-2104", "FZ-2110", "FZ-2118", "FZ-2120", "FZ-2122", "FZ-2130", "FZ-2161", "FZ-2162", "FZ-2163", "FZ-2164", "FZ-2166", "FZ-2191", "FZ-2154", "FZ-2203", "FZ-2207", "FZ-2208", "L-7001", "L-7002", "SF-8427", "SF-8428", "SH-3749", "SH-3773M", "SH-8400", "FZ-5609", "FZ-7001", "FZ-7002" [Product names, which are manufactured by Dow Toray Co., Ltd.], "TSF-4440", "TSF-4441", "TSF-4445", "TSF-4446", "TSF-4450", "TSF-4452", "TSF-4460" [Product names, which are manufactured by Momentive Performance Materials Inc.], "PC-03" [Product name, manufactured by Maruzen Yuka Kogyo Kabushiki-kaisha.]

[Chemical Formula 3]

(3)

In the formula (3), $R^7$ and $R^8$ each independently represent a monovalent organic group.

Examples of the cyclic silane compound having the structural repeat unit represented by the formula (3) include cyclic siloxanes including cyclic dimethylcyclosiloxanes such as hexamethylcyclotrisiloxane, octamethylcyclotetrasiloxane, decamethyl cyclopentasiloxane and dodecamethylcyclohexasiloxane; cyclic methylphenylcyclosiloxanes such as 1,3,5-trimethyl-1,3,5-triphenylcyclotrisiloxane, 1,3,5,7-tetramethyl-1,3,5,7-tetraphenylcyclotetrasiloxane and 1,3,5,7,9-pentamethyl-1,3,5,7,9-pentaphenylcyclopentasiloxane; cyclic phenylcyclosiloxanes such as hexaphenylcyclotrisiloxane; fluorine-containing cyclosiloxanes such as 3-(3,3,3-trifluoropropyl)methylcyclotrisiloxane; hydrosilyl group-containing cyclosiloxanes such as a methylhydrosiloxane mixture, pentamethylcyclopentasiloxane and phenylhydrocyclosiloxane; and vinyl group-containing cyclosiloxanes such as pentavinylpentamethylcyclopentasiloxane.

The silane compound mentioned above may be used alone or as a mixture of two types or more.

The reason why adhesive residue on a mask surface after pleeing a pellicle from the mask decreases by adding a silane compound to an adhesive for a pellicle is not yet known. Provably, the silane compound migrates into the interface between the adhesive and the mask, with the result that the adhesive strength of the adhesive is appropriately reduced to allow the adhesive to easily peel from the mask. With this mechanism, adhesive residue conceivably decreases.

(Additives)

Furthermore, an adhesive, if necessary, may contain additives such as a filler, a color, a diluent and an age resistor. These additives may be used alone or in combination of two or more types. However, it is preferable that the amounts of additives be appropriately set so as to obtain desired physical properties.

Embodiment According to the Second Aspect of the Present Invention

Now, only differences between an embodiment (second embodiment) according to the second aspect of the present invention and the first embodiment will be described. The second embodiment is the same as the first embodiment except the following items and exerts the same effect as in the first embodiment.

The adhesive for a pellicle according to the second embodiment contains a radical trapping agent and/or a UV absorbent in place of a silane compound.

Even if an adhesive for a pellicle is decomposed by light irradiation and generates radicals, a radical trapping agent contained in the adhesive for a pellicle collects the radicals to suppress decomposition of the adhesive. Because of this, it is considered that adhesive residue after peeling a pellicle from the mask decreases. In addition, since a UV absorbent itself contained in an adhesive for a pellicle absorbs light, the effect of light on the adhesive is suppressed. As a result, it is considered that deterioration of the adhesive is suppressed to decrease adhesive residue after peeling a pellicle from the mask.

It is preferable that the radical trapping agent particularly contain at least one of a hindered amine compound or a hindered phenol compound. Furthermore, it is preferable that the UV absorbent contain at least one of a benzophenone compound, a benzotriazole compound, a triadine compound or a benzoate compound. Particularly in the case where exposure light has a short wavelength, a radical trapping agent is more preferable in view of deterioration and the like.

As the hindered amine compound, particularly a compound containing a 2,2'-5,5' tetramethylpiperidine derivative is preferable. Examples of such a compound include TINUVIN (registered trade mark, manufactured by BASF Japan Ltd.), Adekastab LA series (registered trade mark, manufactured by Adeka Corp.), CHIMASSORB (registered trade mark, manufactured by BASF Japan Ltd.) and Hostavin (registered trade mark, manufactured by Clariant). Furthermore, Examples of the hindered phenol compound include Adekastab AO series (registered trade mark, manufactured by Adeka Corp.) and IRGANOX (registered trade mark, manufactured by BASF Japan Ltd.).

Examples of the UV absorbent include Adekastab LA series (registered trade mark manufactured by Adeka Corp.), CHIMASSORB (registered trade mark, manufactured by BASF Japan Ltd.), SUMISORB (registered trade mark manufactured by Sumitomo Chemical Co., Ltd.), CYASORB UV series (registered trade mark, manufactured by CYTEC) and TINUVIN (registered trade mark, manufactured by BASF Japan Ltd.).

If a radical trapping agent is used in combination with a UV absorbent, a plurality of radical trapping agents are used in combination or a plurality of UV absorbents are used in combination, synergistic effect of these can be obtained.

The total content of the radical trapping agent and the UV absorbent in an adhesive for a pellicle relative to the total of all monomers (100 parts by mass) constituting the (meth)acrylic alkyl ester copolymer is preferably 0.001 to 5 parts by mass, more preferably 0.005 to 3 parts by mass and particularly preferably 0.01 to 1 part by mass. If the content is larger than 0.001 part by mass, the effect of decreasing adhesive residue becomes significant. If the content is smaller than 5 parts by mass, sufficient load bearing of a pellicle is provided, peeling of an adhesive from a mask due to bleeding rarely occurs and air path (void) and foaming can be suppressed. Furthermore, if the content falls within the aforementioned range, outgassing can be suppressed.

Embodiment of Method for Manufacturing Pellicle

Pellicles according to the above embodiments can be suitably manufactured by the following method.

First, a solution of a (meth)acrylic alkyl ester copolymer as mentioned above is mixed with a silane compound and a crosslinking agent to prepare a precursor of an adhesive. The precursor of an adhesive may contain a radical trapping agent and/or a UV absorbent in place of a silane compound. The precursor of an adhesive may contain a silane compound and a radical trapping agent and/or a UV absorbent. To form a mask adhesive layer having a predetermined thickness and width by applying the adhesive to an end surface of a pellicle frame, the precursor of an adhesive is further diluted with a solvent to control the viscosity of the precursor. The dilution solvent is selected in consideration of the solubility of a precursor and a evaporation rate and the like. Specific examples of a preferable solvent include acetone, ethyl acetate and toluene. The solvent is not limited to these.

Second, the precursor of an adhesive is applied to an end surface of the pellicle frame. To the other end surface of the pellicle frame, a pellicle film is attached. The method for applying the precursor is not particularly limited; however, it is preferable to apply the precursor to a pellicle frame by use of a dispenser. The viscosity of the precursor of an adhesive is not particularly limited; however, the viscosity is preferably 50 P or less, more preferably 10 to 40 P and further preferably about 20 to 30 P. These viscosity values are those of the precursor of an adhesive at a temperature of 25° C. and measured by a B type viscometer. In a step of applying a precursor by a dispenser, cob-webbing of a coating solution (precursor solution) is suppressed by diluting the precursor with a solvent, with the result that it becomes easy to control width and thickness stably.

The thickness of the adhesive (adhesive layer) applied to a pellicle frame is preferably, 0.1 to 3.5 mm, more preferably 0.5 to 3.0 mm and particularly preferably 0.8 to 2.8 mm. If the thickness falls within the aforementioned range, a pellicle can be attached to a mask while maintaining flatness of the pellicle and the pellicle has satisfactory load bearing.

Third, a solvent and/or the remaining monomer are removed from the adhesive layer formed by coating by heating and drying the adhesive layer. A functional group of a (meth)acrylic alkyl ester copolymer and a crosslinking agent having at least either one of an isocyanate group or an epoxy group are reacted by heating to form a crosslinked structure in the adhesive layer. Owing to the reaction, the adhesive layer comes into close contact with the surface of the pellicle frame to unite the pellicle frame and the adhesive layer into one.

The temperature for heating and drying the adhesive layer is preferably 50 to 200° C. and more preferably 60 to 190° C. in consideration of boiling points of a solvent and the remaining monomer and decomposition temperature of a (meth) acrylic alkyl ester copolymer. It is preferable that an adhesive be sufficiently dried such that the content of a solvent in the adhesive measured by the following outgas test is 50 ppb or less and thereafter a pellicle is used.

After heating and drying (after completion of the crosslinking reaction), a protection film may be attached to the adhesive layer. The thickness of the protection film is about 30 to 200 μm and a film formed of e.g., polyester, may be used. Furthermore, if the peel force in peeling a protection film from the adhesive layer is large, the adhesive may be deformed at the time of peeling the film. Accordingly, to reduce the peel force to an appropriate level, the surface of the protection film in contact with the adhesive layer may be treated with a mold-releasing agent such as silicone and fluorine.

After a protection film is attached, load is applied to the adhesive layer to make the surface of the adhesive layer substantially flat.

Embodiment of Photomask with Pellicle

The photomask with a pellicle according to this embodiment is provided with a pellicle according to the first embodiment or second embodiment.

Embodiment of Method for Manufacturing Semiconductor Device

The method for manufacturing a semiconductor device according to this embodiment has a step of exposing the substrate to light with a photomask with a pellicle as mentioned above. In a photolithography step, which is a step of manufacturing a semiconductor device, in order to form a photoresist pattern corresponding to an integrated circuit on a wafer (substrate), the photomask with a pellicle is set on a stepper and then light is applied. Owing to this, even if foreign matter adheres to the pellicle in the photolithography step, an image of the foreign matter is not formed on the wafer coated with the photoresist. Owing to this, e.g., short circuit and wire breakage of a semiconductor integrated circuit caused by an image of foreign matter can be prevented. As a result, yield in a photolithography step can be improved.

Since the photomask with a pellicle according to the above embodiment has appropriate and stable adhesive strength, adhesive is rarely left as a residue when the pellicle is peeled from the photomask. Accordingly, the manufacturing efficiency of a semiconductor device can be increased by use of the photomask with a pellicle according to the above embodiment. Furthermore, since the amount of outgas from the adhesive for a pellicle according to the above embodiment is low, the life of the adhesive for a pellicle according to the above embodiment is long. Furthermore, since adhesive residue is decreased according to the above embodiment, adhesive residue on a mask can be more reliably removed in a step of washing a mask after peeling the pellicle.

EXAMPLES

Now, the present invention will be more specifically described by way of Examples and Comparative Examples; however, the present invention is not limited by these.

Examples 1 to 21 of the First Aspect of the Present Invention

Example 1

Preparation of Adhesive (Meth)acrylic alkyl ester copolymer 1 was prepared in accordance with the following method. In a reaction container equipped with a stirrer, a thermometer, a reflux condenser, a drip device and a nitrogen inlet pipe, ethyl acetate (30 parts by mass) was poured. Further, a mixture (32 parts by mass) of isobutyl acrylate (Component A2)/butyl acrylate (Component A1)/acrylic acid (Component B)/2-hydroxyethyl acrylate (Component B)/2,2'-azobisisobutyronitrile (polymerization initiator) was supplied to the reaction container to prepare a reaction solution. The mass ratio of isobutyl acrylate (Component A2), butyl acrylate (Component A1), acrylic acid (Component B), 2-hydroxyethyl acrylate (Component B), and 2,2'-azobisisobutyronitrile (polymerization initiator) was controlled to be 48:48:1.5:2.5:0.5.

Under a nitrogen atmosphere, the above reaction solution was heated to reflux at a predetermined temperature to allow a polymerization reaction to proceed in the reaction container for 8 hours. After completion of the reaction, toluene (38 parts by mass) was added to the reaction solution to obtain a solution of (meth)acrylic alkyl ester copolymer 1 having a non-volatile content in a concentration of 32 mass %. The weight-average molecular weight of (meth)acrylic alkyl ester copolymer 1 was 1,200,000. The weight-average molecular weight was measured by the method described later.

To the solution of (meth)acrylic alkyl ester copolymer 1, a solution of a polyfunctional epoxy compound (crosslinking agent) and a silane compound were added. Thereafter, the solution mixture was stirred and mixed to obtain the adhesive for a pellicle of Example 1.

The solution of a crosslinking agent contained a polyfunctional epoxy compound, i.e., 1,3-bis(N,N-diglycidylaminomethyl)cyclohexane as a crosslinking agent. As the solvent for a crosslinking agent, toluene was used. The concentration of a nonvolatile content in the crosslinking agent solution was 5 mass %.

The addition amount of crosslinking agent relative to the total of all monomers (100 parts by mass) constituting (meth) acrylic alkyl ester copolymer 1 was controlled to 0.25 parts by mass.

As the silane compound, an epoxy-modified silicone oil (SF8421 manufactured by Dow Toray Co., Ltd.) was used. The addition amount of silane compound relative to the total of all monomers (100 parts by mass) constituting (meth) acrylic alkyl ester copolymer 1 was controlled to 0.1 part by mass.

(Preparation of Pellicle)

Then, to one of the end surfaces of a pellicle frame made of an aluminum alloy, the adhesive for a pellicle mentioned above was applied by a dispenser. To the other end surface of the pellicle frame, a pellicle film was attached over the entire frame. The outer diameter of the pellicle frame was 113 mm×149 mm and the inner diameter was 109 mm×145 mm and the height was 4.8 mm.

The adhesive for a pellicle applied to the pellicle frame was heated/dried and cured in two steps. In the first step of the heating/drying and curing, the adhesive for a pellicle was heated at 100° C. for 8 minutes. In the second step of the heating/drying and curing, the adhesive for a pellicle was heated at 180° C. for 8 minutes. After heating, the thickness of the adhesive for a pellicle (adhesive layer) was 0.2 mm.

As a protection film, a polyester film was used. The thickness of the protection film was 100 μm. The surface of the protection film was treated with a release agent, i.e., silicone. The surface of the protection film treated with the release agent was allowed to face the surface of the adhesive layer and joined. The adhesive layer was cured at room temperature (20±3° C.) for 3 days to stabilize the adhesive strength of the adhesive layer. The following steps were carried out to accomplish the pellicle of Example 1.

Example 2

The pellicle of Example 2 was prepared in the same manner as in Example 1 except that the addition amount of crosslinking agent was controlled to 0.1 part by mass.

Example 3

The pellicle of Example 3 was prepared in the same manner as in Example 1 except that 0.1 part by mass of an epoxy-modified silicone oil (X-22-4741 manufactured by Shin-Etsu Chemical Co., Ltd.) was used as a silane compound in place of SF8421.

Example 4

The pellicle of Example 4 was prepared in the same manner as in Example 1 except that 0.1 part by mass of an epoxy-modified silicone oil (KF-1002 manufactured by Shin-Etsu Chemical Co., Ltd.) was used as a silane compound in place of SF8421.

Example 5

The pellicle of Example 5 was prepared in the same manner as in Example 1 except that 1.0 part by mass of an epoxy-modified silicone oil (SF8421 manufactured by Dow Toray Co., Ltd.) was used as a silane compound in place of SF8421.

Example 6

Preparation of Adhesive (Meth)acrylic alkyl ester copolymer 2 was prepared in accordance with the following method. In a reaction container equipped with a stirrer, a thermometer, a reflux condenser, a drip device and a nitrogen inlet pipe, ethyl acetate (30 parts by mass) was poured. Further, a mixture (32 parts by mass) of butyl acrylate (Component A1)/acrylic acid (Component B) was supplied to the reaction container to prepare a reaction solution. The mass ratio of butyl acrylate (Component A1) and acrylic acid (Component B) was controlled to be 99:1.

Under a nitrogen atmosphere, the above reaction solution was heated at 60° C. for 8 hours to allow a polymerization reaction to proceed in the reaction container. After completion of the reaction, toluene (38 parts by mass) was added to the reaction solution to obtain a solution of (meth)acrylic alkyl ester copolymer 2 having a nonvolatile content in a concentration of 32 mass %. The weight-average molecular weight of (meth)acrylic alkyl ester copolymer 2 was 1,800,000. The weight-average molecular weight was measured by the method described later.

To the solution of (meth)acrylic alkyl ester copolymer 2, a solution of a polyfunctional epoxy compound (crosslinking agent) and a silane compound were added. Thereafter, the solution mixture was stirred and mixed to obtain the adhesive for a pellicle of Example 6.

The solution of the crosslinking agent contained a polyfunctional epoxy compound, i.e., 1,3-bis(N,N-diglycidylaminomethyl)cyclohexane as a crosslinking agent. As the solvent for the crosslinking agent, toluene was used. The concentration of a nonvolatile content in the crosslinking agent solution was 5 mass %.

The addition amount of crosslinking agent relative to the total of all monomers (100 parts by mass) constituting (meth) acrylic alkyl ester copolymer 2 was controlled to 0.18 parts by mass.

As the silane compound, an epoxy-modified silicone oil (KF-1002 manufactured by Shin-Etsu Chemical Co., Ltd.) was used. The addition amount of silane compound relative to the total of all monomers (100 parts by mass) constituting (meth)acrylic alkyl ester copolymer 2 was controlled to 0.1 part by mass.

The pellicle of Example 6 was prepared in the same manner as in Example 1 except that the adhesive for a pellicle of Example 6 was used in place of the adhesive for a pellicle of Example 1.

Example 7

The pellicle of Example 7 was prepared in the same manner as in Example 1 except that the addition amount of silane compound, SF8421 was controlled to 7.0 parts by mass.

Example 8

In Example 8, a trimethylolpropane adduct of tolylene diisocyanate was used as a crosslinking agent in place of 1,3-bis(N,N-diglycidylaminomethyl)cyclohexane. In Example 8, the amount of crosslinking agent was controlled to 0.25 parts by mass. The pellicle of Example 8 was prepared in the same manner as in Example 1 except the aforementioned points.

Example 9

The pellicle of Example 9 was prepared in the same manner as in Example 1 except that a dimethyl silicone oil (KF-96 manufactured by Shin-Etsu Chemical Co., Ltd.) was used as a silane compound in place of SF8421.

Example 10

The pellicle of Example 10 was prepared in the same manner as in Example 1 except that a methylphenyl silicone oil (KF-50 manufactured by Shin-Etsu Chemical Co., Ltd.) was used as a silane compound in place of SF8421.

Example 11

The pellicle of Example 11 was prepared in the same manner as in Example 1 except that a methyl hydrogen silicone oil (KF-99 manufactured by Shin-Etsu Chemical Co., Ltd.) was used as a silane compound in place of SF8421.

Example 12

The pellicle of Example 12 was prepared in the same manner as in Example 1 except that an epoxy-modified silicone oil (KF-1001 manufactured by Shin-Etsu Chemical Co., Ltd.) was used as a silane compound in place of SF8421.

Example 13

The pellicle of Example 13 was prepared in the same manner as in Example 1 except that a dimethyl silicone oil (X-22-173DX manufactured by Shin-Etsu Chemical Co., Ltd.) was used as a silane compound in place of SF8421.

Example 14

The pellicle of Example 14 was prepared in the same manner as in Example 1 except that a polyether-modified silicone oil (X-22-4272 manufactured by Shin-Etsu Chemical Co., Ltd.) was used as a silane compound in place of SF8421.

Example 15

The pellicle of Example 15 was prepared in the same manner as in Example 1 except that a polyether-modified silicone oil (KF-6017 manufactured by Shin-Etsu Chemical Co., Ltd.) was used as a silane compound in place of SF8421.

Example 16

The pellicle of Example 16 was prepared in the same manner as in Example 1 except that an alkyl-modified silicone oil (SF-8416 manufactured by Dow Toray Co., Ltd.) was used as a silane compound in place of SF8421.

Example 17

The pellicle of Example 17 was prepared in the same manner as in Example 1 except that a polyether-modified silicone oil (SF-8427 manufactured by Dow Toray Co., Ltd.) was used as a silane compound in place of SF8421.

Example 18

The pellicle of Example 18 was prepared in the same manner as in Example 1 except that a polyether-modified silicone oil (SH-8400 manufactured by Dow Toray Co., Ltd.) was used as a silane compound in place of SF8421.

Example 19

The pellicle of Example 19 was prepared in the same manner as in Example 1 except that a monoamine-modified silicone oil (KF-865 manufactured by Shin-Etsu Chemical Co., Ltd.) was used as a silane compound in place of SF8421.

Example 20

The pellicle of Example 20 was prepared in the same manner as in Example 1 except that a polyether-modified silicone oil (X-22-3939A manufactured by Shin-Etsu Chemical Co., Ltd.) was used as a silane compound in place of SF8421.

Example 21

The pellicle of Example 21 was prepared in the same manner as in Example 1 except that a polyether-modified silicone oil (X-22-3701E manufactured by Shin-Etsu Chemical Co., Ltd.) was used as a silane compound in place of SF8421.

Comparative Example 1

The pellicle of Comparative Example 1 was prepared in the same manner as in Example 1 except that a silane compound was not used. Note that the pressure-sensitive additive of Comparative Example 1 neither contained a radical trapping agent nor a UV absorbent.

Examples 31 to 38 of the Second Aspect of the Present Invention

Example 31

In preparing the adhesive for a pellicle of Example 31, a radical trapping agent was used in place of a silane compound. As the radical trapping agent, TINUVIN770DF (hindered amine, manufactured by BASF Japan Ltd.) was used. The addition amount of radical trapping agent relative to the total of all monomers (100 parts by mass) constituting (meth) acrylic alkyl ester copolymer 1, was controlled to 3.0 parts by mass. The pellicle of Example 31 was prepared in the same manner as in Example 1 except the aforementioned points.

Example 32

The pellicle of Example 32 was prepared in the same manner as in Example 31 except that 1.0 part by mass of TINUVIN123 (hindered amine, manufactured by BASF Japan Ltd.) was used as a radical trapping agent in place of TINUVIN770DF.

Example 33

The pellicle of Example 33 was prepared in the same manner as in Example 31 except that 4.5 parts by mass of TINTJVIN292 (hindered amine, manufactured by BASF Japan Ltd.) was used as a radical trapping agent in place of TINUVIN770DF.

Example 34

In preparing the adhesive for a pellicle of Example 34, 2.0 parts by mass of TINUVIN123 (hindered amine, manufactured by BASF Japan Ltd.) was used as a radical trapping agent in place of TINUVIN770DF. Furthermore, in Example 34, the addition amount of crosslinking agent was controlled to 0.1 part by mass. The pellicle of Example 34 was prepared in the same manner as in Example 31 except the aforementioned points.

Example 35

In preparing the adhesive for a pellicle of Example 35, a UV absorbent was used in place of a radical trapping agent. As the UV absorbent, TINUVIN120 (benzoate compound, manufactured by BASF Japan Ltd.) was used. The addition amount of UV absorbent relative to the total of all monomers (100 parts by mass) constituting (meth)acrylic alkyl ester copolymer 1 was controlled to 3.0 parts by mass. The pellicle of Example 35 was prepared in the same manner as in Example 31 except the aforementioned points.

Example 36

In preparing the adhesive for a pellicle of Example 36, a radical trapping agent was used in place of a silane compound. As the radical trapping agent, IRGANOX1076 (hindered phenol compound, manufactured by BASF Japan Ltd.) was used. As the radical trapping agent, IRGANOX1076 (hindered phenol compound manufactured by BASF Japan Ltd.) was used. The addition amount of radical trapping agent relative to the total of all monomers (100 parts by mass) constituting (meth)acrylic alkyl ester copolymer 2 was controlled to 3.0 parts by mass. The pellicle of Example 36 was prepared in the same manner as in Example 6 except the aforementioned points.

Example 37

In Example 37, as a crosslinking agent, a trimethylolpropane adduct of tolylene diisocyanate was used in place of 1,3-bis(N,N-diglycidylaminomethyl)cyclohexane. In Example 37, the addition amount of crosslinking agent was controlled to 0.45 parts by mass. The pellicle of Example 37 was prepared in the same manner as in Example 31 except the aforementioned points.

Example 38

The pellicle of Example 38 was prepared in the same manner as in Example 31 except that 10.0 parts by mass of TINUVIN292 (hindered amine, manufactured by BASF Japan Ltd.) was used as a radical trapping agent in place of TINUVIN770DF.

The pellicles obtained in Examples and Comparative Examples were evaluated by the following method.

[Determination of Molecular Amount]

A solution of a polymer was dried under vacuum to remove a solvent. To the resultant polymer, a solvent was added to prepare a polymer solution. The concentration of the polymer in the solution was controlled to 1.0 mg/mL. The solution was filtered by a filter having a pore diameter of 0.5 microns. The filtrate was analyzed by GPC (Gel Permeation Chromatography) to determine the weight-average molecular weight of the polymer. The conditions of GPC were as follows.

GPC Data processing: GPC-8020, Tohso Corporation
Apparatus: HLC-8220GPC, Tohso Corporation
Column: Single column of TSKgel SuperHZN-M
  (4.6 mm I.D.×15 cm)+single column of TSKgel SuperHZ2000 (4.6 mm I.D.×15 cm)
Oven: 40° C.
Eluent: CHCl, 0.35 mL/minute
Sample amount: 50 μL (1.0 mg/mL)
Detector: RI
Calibration curve: Polystyrene

[Adhesive Residue]

Load was applied to a pellicle from which a protection film was peeled-off to attach the pellicle to a mask blank base provided with 6025 chromium. Attachment is performed by use of a simplified mounter. The weight of the load was 30 Kgf and the load was applied for 60 sec.

The base attached with the pellicle was allowed to stand still at room temperature (20±3° C.) for 2 months. After that, the base was immobilized horizontally, one of the corners of the pellicle was pulled up by a tension tester in perpendicular to the mask surface at a rate of 5 min/min to peel the pellicle from the base. The state of the base surface was observed and the area of a portion coated with the remaining adhesive for a pellicle (area of adhesive residue) was measured. Based on the area of adhesive residue, the amount of adhesive residue in each pellicle was evaluated based on the following criteria. The evaluation results are shown in Tables 1 to 3. Note that the following term "whole adhesion area" refers to the surface portion of the base to which a pellicle was attached before the pellicle was peeled from the base.

A: The ratio of the area of adhesive residue to the whole adhesion area is 0 to 5%.
B: The ratio of the area of adhesive residue to the whole adhesion area is 6 to 20%.
C: The ratio of the area of adhesive residue to the whole adhesion area is 21 to 100%.

[Outgas Test]

A pellicle was heated at 50° C. for 30 minutes under helium air flow of 50 mL/minute. The outgas (toluene) generated from the pellicle during heating was collected by an adsorption tube charged with an adsorbent. As the adsorbent, TENAX TA (manufactured by GL Sciences) was used. The adsorption tube was guided into a GC apparatus by use of a head spacer sampler. The adsorption tube was heated at 250° C. for 10 minutes to desorb the gas. The generated outgas was analyzed by GC (Gas Chromatography)/MS (Mass Spectrometry). The conditions of GC/MS were as follows.

GC apparatus: 7890A GC System, Agilent Technologies,
Column: 19091J-413, HP-5 (30 m×0.320 mm×0.25 μm), Agilent Technologies,
Temperature conditions: 30 to 280° C. (10° C./min)
MS apparatus: JEOL Jms-Q1000GC K9
Ionization: 70 eV
Scan range: m/z=10 to 500

The mass of toluene obtained from an absolute calibration curve was divided by the mass of a pellicle to computationally obtain the amount of outgas per pellicle (unit: ppb). The amount of outgas was evaluated based on the following criteria. The evaluation results are shown in Tables 1 to 3.

A: 10 ppb or less
B: more than 10 ppb to 50 ppb or less
C: 51 ppb or more

[Load Bearing Test]

Load was applied to a pellicle from which a protection film was peeled-off to attach the pellicle to a 6025 quartz blank base and a mask blank base provided with 6025 chromium. Attachment was performed by use of a simplified mounter. The weight of the load was 30 Kgf and the load was applied for 60 sec.

A weight of 1 Kg was added to the pellicle attached to the base and the base was allowed to stand still at room temperature. The time until the pellicle peeled from the base was measured. Based on the measurement time, the load bearing of the pellicle was evaluated in accordance with the following criteria. The evaluation results are shown in Tables 1 to 3.

A: Air path is not formed even after 3 days.
B: Pellicle falls from the base after one day.
C: Pellicle falls from the base after 3 hours.

The compositions and evaluation results of the adhesives for a pellicle according to Examples and Comparative Examples are collectively shown in Tables 1 to 3. In the tables, "Component A" refers to a (meth)acrylic alkyl ester having an alkyl group of 4 to 14 carbon atoms. "Component B" refers to a monomer having a functional group reactive to at least either one of an isocyanate group or an epoxy group. The "crosslinking agent" refers to a crosslinking agent having at least either one functional group of an isocyanate group or an epoxy group. The "molecular amount" refers to the weight-average molecular weight of a (meth)acrylic alkyl ester copolymer contained in an adhesive. The abbreviation "i-BA" stands for isobutyl acrylate. The abbreviation "BA" stands for butyl acrylate. The abbreviation "AA" stands for acrylic acid. The abbreviation "HEA" stands for 2-hydroxyethyl acrylate. The compositions of adhesives for a pellicle of all Examples shown in Table 2 are the same as those shown in Example 1 except the type of silane compound.

TABLE 1

|  | Composition | Example 1 | Example 2 | Example 3 | Example 4 | Example 5 |
|---|---|---|---|---|---|---|
| Component A [parts by mass] | i-BA | 48 | 48 | 48 | 48 | 48 |
|  | BA | 48 | 48 | 48 | 48 | 48 |
| Component B [parts by mass] | AA | 1.5 | 1.5 | 1.5 | 1.5 | 1.5 |
|  | HEA | 2.5 | 2.5 | 2.5 | 2.5 | 2.5 |
| Silane compound [parts by mass] | SF8421 | 0.1 | 0.1 | 0 | 0 | 1 |
|  | X-22-4741 | 0 | 0 | 0.1 | 0 | 0 |
|  | KF-1002 | 0 | 0 | 0 | 0.1 | 0 |
| Crosslinking agent [parts by mass] | 1,3-Bis(N,N-diglycidylaminomethyl)cyclohexane | 0.25 | 0.1 | 0.25 | 0.25 | 0.25 |
|  | Trimethylol propane adduct of tolylene diisocyanate | 0 | 0 | 0 | 0 | 0 |
| Molecular weight |  | 1,200,000 | 1,200,000 | 1,200,000 | 1,200,000 | 1,200,000 |
| Adhesive residue |  | A | A | A | A | A |
| Outgas |  | B | B | B | B | B |
| Load bearing |  | A | A | A | A | A |

|  | Composition | Example 6 | Example 7 | Example 8 | Comparative Example 1 |
|---|---|---|---|---|---|
| Component A [parts by mass] | i-BA | 0 | 48 | 48 | 48 |
|  | BA | 99 | 48 | 48 | 48 |
| Component B [parts by mass] | AA | 1 | 1.5 | 1.5 | 1.5 |
|  | HEA | 0 | 2.5 | 2.5 | 2.5 |
| Silane compound [parts by mass] | SF8421 | 0 | 7 | 0.1 | 0 |
|  | X-22-4741 | 0 | 0 | 0 | 0 |
|  | KF-1002 | 0.1 | 0 | 0 | 0 |
| Crosslinking agent [parts by mass] | 1,3-Bis(N,N-diglycidylaminomethyl)cyclohexane | 0.18 | 0.25 | 0 | 0.25 |
|  | Trimethylol propane adduct of tolylene diisocyanate | 0 | 0 | 0.25 | 0 |
| Molecular weight |  | 1,800,000 | 1,200,000 | 1,200,000 | 1,200,000 |
| Adhesive residue |  | A | A | A | C |
| Outgas |  | B | B | B | B |
| Load bearing |  | A | C | A | A |

TABLE 2

|  | Silane compound | Adhesive residue | Outgas | Load bearing |
|---|---|---|---|---|
| Example 9 | KF-96 | B | A | B |
| Example 10 | KF-50 | B | A | B |
| Example 11 | KF-99 | B | A | B |
| Example 12 | KF-1001 | B | A | B |
| Example 13 | X-22-173DX | B | A | B |
| Example 14 | X-22-4272 | A | A | B |
| Example 15 | KF-6017 | A | A | B |
| Example 16 | SF8416 | B | A | B |
| Example 17 | SF8427 | A | A | B |
| Example 18 | SH8400 | A | A | B |
| Example 19 | KF865 | B | A | B |
| Example 20 | X-22-3939A | A | A | B |
| Example 21 | X-22-3701E | B | A | B |

TABLE 3

| | Composition | Example 31 | Example 32 | Example 33 | Example 34 | Example 35 | Example 36 | Example 37 | Example 38 |
|---|---|---|---|---|---|---|---|---|---|
| Component A [parts by mass] | i-BA | 48 | 48 | 48 | 48 | 48 | 0 | 48 | 48 |
| | BA | 48 | 48 | 48 | 48 | 48 | 99 | 48 | 48 |
| Component B [parts by mass] | AA | 1.5 | 1.5 | 1.5 | 1.5 | 1.5 | 1 | 1.5 | 1.5 |
| | HEA | 2.5 | 2.5 | 2.5 | 2.5 | 2.5 | 0 | 2.5 | 2.5 |
| Radical trapping agent [parts by mass] | TINUVIN770DF | 3.0 | 0 | 0 | 0 | 0 | 0 | 3.0 | 0 |
| | TINUVIN123 | 0 | 1.0 | 0 | 2.0 | 0 | 0 | 0 | 0 |
| | TINUVIN292 | 0 | 0 | 4.5 | 0 | 0 | 0 | 0 | 10.0 |
| | IRGANOX1076 | 0 | 0 | 0 | 0 | 0 | 3.0 | 0 | 0 |
| UV absorbent [parts by mass] | TINUVIN120 | 0 | 0 | 0 | 0 | 3.0 | 0 | 0 | 0 |
| Crosslinking agent [parts by mass] | 1,3-Bis (N,N-diglycidyl aminomethyl) cyclohexane | 0.25 | 0.25 | 0.23 | 0.1 | 0.25 | 0.18 | 0 | 0.25 |
| | Trimethylol-propane adduct of tolylene diisocyanate | 0 | 0 | 0 | 0 | 0 | 0 | 0.45 | 0 |
| Molecular weight | | 1,200,000 | 1,200,000 | 1,200,000 | 1,200,000 | 1,200,000 | 1,800,000 | 1,200,000 | 1,200,000 |
| Adhesive residue | | A | A | A | A | A | A | A | A |
| Outgas | | B | B | B | B | B | B | B | B |
| Load bearing | | A | A | A | A | A | A | A | C |

INDUSTRIAL APPLICABILITY

According to the pellicle, adhesive for the pellicle, photomask with the pellicle and the method for manufacturing a semiconductor device using the photomask with the pellicle according to the present invention, adhesive residue on a mask after lithographic exposure and the amount of outgas can be decreased. Furthermore, the pellicle according to the present invention has excellent adsorption performance of an organic gas. Therefore, the present invention can be suitably used in lithography steps of e.g., IC (integrated circuit), LSI (large-scale integrated circuit) and TFT-type LCD (thin film transistor liquid crystal display). The pellicle according to the present invention is suitable for lithography particularly using ultraviolet rays having a wavelength of 200 nm or less as exposure light.

REFERENCE SIGNS LIST

1 . . . pellicle, 2 . . . pellicle frame, 2e, 2f . . . end surfaces of pellicle frame, 3 . . . pellicle film, 10 . . . adhesive for a pellicle (adhesive layer), F . . . protection film.

The invention claimed is:

1. A pellicle comprising a pellicle frame, a tensioned pellicle film placed on one end surface of the pellicle frame and an adhesive applied to the other end surface thereof, wherein
the adhesive contains a (meth)acrylic alkyl ester copolymer and a silane compound, and wherein
the (meth)acrylic alkyl ester copolymer is a copolymer of a (meth)acrylic alkyl ester having an alkyl group of 4 to 14 carbon atoms and a monomer having a functional group reactive to at least either one of an isocyanate group or an epoxy group, and the silane compound has a structural repeat unit represented by —(Si—O)— in a main framework of the silane compound.

2. The pellicle according to claim 1, wherein the silane compound has an alkylene oxide framework.

3. The pellicle according to claim 1, wherein the silane compound has an epoxy group.

4. The pellicle according to claim 1, wherein a content of the silane compound relative to 100 parts by mass of a total of all monomers constituting the (meth)acrylic alkyl ester copolymer is 0.001 to 7 parts by mass.

5. The pellicle according to claim 1, wherein the monomer contains an acrylic acid and a content of the acrylic acid relative to 100 parts by mass of a total of all monomers constituting the (meth)acrylic alkyl ester copolymer is 0.1 to 5 parts by mass.

6. The pellicle according to claim 1, wherein the adhesive contains a reaction product between 100 parts by mass of the (meth)acrylic alkyl ester copolymer and 0.05 to 3 parts by mass of a crosslinking agent.

7. The pellicle according to claim 6, wherein the crosslinking agent is at least either one of a polyfunctional epoxy compound or an isocyanate compound.

8. The pellicle according to claim 7, wherein the polyfunctional epoxy compound is a nitrogen-containing epoxy compound having 2 to 4 epoxy groups.

9. The pellicle according to claim 1, wherein a weight-average molecular weight of the (meth)acrylic alkyl ester copolymer is 500,000 to 2,500,000.

10. The pellicle according to claim 1, wherein a thickness of the adhesive is 0.1 to 3.5 mm.

11. A photomask with a pellicle, attached with the pellicle according to claim 1.

12. A method for manufacturing a semiconductor device comprising a step of exposing a substrate to light by using the photomask with a pellicle according to claim 11.

13. A pellicle having a pellicle frame, a tensioned pellicle film placed on one end surface of the pellicle frame and an adhesive applied to the other end surface thereof, wherein
the adhesive contains a (meth)acrylic alkyl ester copolymer, a radical trapping agent and optionally a UV absorbent, and wherein
the (meth)acrylic alkyl ester copolymer is a copolymer of a (meth)acrylic alkyl ester having an alkyl group of 4 to 14 carbon atoms and a monomer having a functional group reactive to at least either one of an isocyanate group or an epoxy group; and
the radical trapping agent contains at least one of a hindered amine compound or a hindered phenol compound.

14. The pellicle according to claim 13, wherein the UV absorbent contains at least one of a benzophenone compound, a benzotriazole compound, a triazine compound or a benzoate compound.

15. The pellicle according to claim 13, wherein a total content of the radical trapping agent and the UV absorbent relative to 100 parts by mass of a total of all monomers constituting the (meth)acrylic alkyl ester copolymer is 0.001 to 5 parts by mass.

16. The pellicle according to claim 13, wherein the monomer contains an acrylic acid and a content of the acrylic acid relative to 100 parts by mass of a total of all monomers constituting the (meth)acrylic alkyl ester copolymer is 0.1 to 5 parts by mass.

17. The pellicle according to claim 13, wherein the adhesive contains a reaction product between 100 parts by mass of the (meth)acrylic alkyl ester copolymer and 0.05 to 3 parts by mass of a crosslinking agent.

18. A photomask with a pellicle, attached with the pellicle according to claim 13.

* * * * *